United States Patent
Wozniak

(10) Patent No.: US 7,080,331 B2
(45) Date of Patent: Jul. 18, 2006

(54) METHOD AND SYSTEM FOR AUTOMATIC RECOGNITION OF SIMULATION CONFIGURATIONS OF AN INTEGRATED CIRCUIT

(75) Inventor: Andrzej Wozniak, Palaiseau (FR)

(73) Assignee: Bull, S.A., Les Clayes Sous Bois (FR)

( * ) Notice: Subject to any disclaimer, the term of this patent is extended or adjusted under 35 U.S.C. 154(b) by 322 days.

(21) Appl. No.: 10/627,690

(22) Filed: Jul. 28, 2003

(65) Prior Publication Data

US 2004/0024577 A1    Feb. 5, 2004

(30) Foreign Application Priority Data

Jul. 30, 2002    (FR) .................................. 02 09689

(51) Int. Cl.
G06F 17/50    (2006.01)

(52) U.S. Cl. ................................. 716/4; 716/5; 716/14

(58) Field of Classification Search .................... 716/4, 716/5, 14; 703/14
See application file for complete search history.

(56) References Cited

U.S. PATENT DOCUMENTS

| | | | |
|---|---|---|---|
| 5,732,247 A * | 3/1998 | Dearth et al. .................. 703/13 |
| 5,748,875 A | 5/1998 | Tzori | |
| 5,953,707 A * | 9/1999 | Huang et al. .................. 705/10 |
| 6,578,174 B1 * | 6/2003 | Zizzo ............................. 716/1 |
| 6,651,225 B1 * | 11/2003 | Lin et al. ....................... 716/4 |
| 2001/0043237 A1 * | 11/2001 | Schmieder .................. 345/839 |
| 2002/0083402 A1 * | 6/2002 | Higashitsutsumi et al. .... 716/4 |

\* cited by examiner

*Primary Examiner*—Sun James Lin
(74) *Attorney, Agent, or Firm*—Miles & Stockbridge P.C.; Edward J. Kondracki

(57) ABSTRACT

The invention relates to a method for automatic recognition of simulation configurations of integrated circuits under design comprising at least two components connected to one another directly or indirectly, for the functional verification of the integrated circuits through simulation tests. The method includes a step for the acquisition of a simulation configuration by a server manager, a step for the sending of a request by a client manager to the server manager, a step for sending a response by the server manager to the client manager, and a step for the comparison by the client manager of the response with the requirements of the test, followed by a step for the disabling, activation and/or modification of certain parts of the test by the client manager in order to adapt the test to the configuration or signaling an error if the test cannot be adapted to the configuration.

18 Claims, 5 Drawing Sheets

HDL modeling

General case

C++ modeling

METHOD AND SYSTEM FOR AUTOMATIC RECOGNITION OF SIMULATION CONFIGURATIONS OF AN INTEGRATED CIRCUIT

CROSS REFERENCE TO RELATED APPLICATIONS

The subject matter of this application is related to U.S. patent application Ser. No. 10/627,977, filed concurrently herewith in the name of Andrzej WOZNIAK, entitled "Procédé et système d'établissement automatique d'un modèle global de simulation d'une architecture" (English title: "System and Method for Automatically Generating a Global Simulation Model of An Architecture", and corresponding to French Application No. FR 02/0969, filed Jul. 30, 2002, the subject matter of which is hereby incorporated by reference.

FIELD OF THE INVENTION

The invention concerns a method and a system for the automatic recognition of simulation configurations for the functional verification of ASIC integrated circuits through simulation tests. More specifically, the invention concerns a method for automatic recognition of simulation configurations and a system for implementing the method.

BACKGROUND OF THE INVENTION

With the increase in the complexity of hardware systems, it is necessary to be able to deal with system configurations that are increasingly combining models written in a hardware description language, for example of the HDL type (the languages VDHL and Verilog being the most frequently used), and in high level languages of the HLL type (such as C or C++); these languages describe both the elements constituting the hardware and the models constituting the simulation environment.

In the description below, the term "simulation configuration" or "configuration" will be used to designate a set of software models of elements called "components" constituting a global simulation model, the components being connected to one another either directly or through intermediate blocks.

The invention can be used to verify the design of ASICs by simulating their operation, for example in an environment identical to or very similar to their end use; the method for automatic recognition of configurations enables tests to identify the components of a configuration.

In the case of an ASIC that contains a lot of elements and is connected to several external circuits, it is difficult to predict in advance all of the usable configurations and to establish the relationships between the configuration sets that combine various configuration properties and the test sets that are applicable to them. For this reason, the use of certain configuration variants that facilitate debugging is often avoided, since these variants may involve only some of the components, thus simulating only part of the ASIC or its environment.

In order to cover all of the variants of a simulation configuration, it is necessary to have a large number of test variants specific to each configuration. This situation is a potential error source, since each modification and correction of a test must be saved and verified in each variant of the test.

SUMMARY OF THE INVENTION

One object of the present invention is to limit the drawbacks of test program debugging based on available simulation configurations.

This object is achieved through a method for the automatic recognition of the available simulation configurations of integrated circuits under design comprising at least two components connected to one another directly or indirectly, for the functional verification of said circuits through simulation tests, characterized in that it comprises:

- a step for the acquisition of a simulation configuration by a first manager, called a "server manager," associated with the simulator, during the initialization of the simulator program, during which all the constructors of HLL (C++) instances of components present in the current global simulation model are called, each of these constructors registering its presence by transmitting its own parameters (label, type, HDL path, etc.) to the server manager, which constructs the instance table of the components,
- a step for the sending of a request by a second manager, called the "client manager," to the server manager in order to learn whether the components expected in a configuration by the client manager are present and what their positions (indicated by the labels) and their types are,
- a step for the sending of a response by the server manager to the client manager, after a consultation of the instance table of the components, which response contains the instances of the components present and/or an error notification in case of the absence of one or more expected components, and for the storing of the response in at least one configuration model storage table by the client manager,
- a step for the comparison by the client manager of the response with the requirements of the test, followed by a step for the disabling, activation and/or modification of certain parts of the test by the client manager in order to adapt the test to the configuration, or the signaling of an error if that proves impossible.

According to another characteristic, the simulation configurations are generated from configuration generation data, prior to the utilization of the method according to the invention.

According to another characteristic, the generation of the configurations is handled by a human operator.

According to another characteristic, the generation of the configurations is handled by an automatic configuration generator.

According to another characteristic, the step for sending a request is followed by a step for the translation of said request, by a program interface, into a language understandable by the first manager, and this step for sending a response is followed by a step for the translation of said response, by the program interface, into a language understandable by the second manager.

According to another characteristic, the method for automatic recognition of configurations operates in a client-server architecture, the first manager being located in the server and the second manager being located in the client.

Another object of the invention is to offer a system for implementing the method according to the invention.

This object is achieved through a system for the recognition of the available simulation configurations of integrated circuits under design, characterized in that it comprises a first manager equipped with means for formulating and/or analyzing a message, storage means, and means for filling and consulting at least one table, called an instance table, of the components present in each configuration, and in that it comprises a second manager equipped with means for formulating a message and/or a request, means for analyzing a message, and means for filling and consulting at least one table for storing the configuration models.

According to another characteristic, the second manager is equipped with means for disabling, activating, and/or modifying certain parts of the test in order to adapt the test based on the response.

The invention will be better understood with the help of the following description of an exemplary embodiment of the method of the invention, in reference to the attached drawings, in which.

DESCRIPTION OF THE PREFERRED EMBODIMENTS

A global simulation model is typically composed of one or more models of integrated circuits being tested (DUTs) surrounded by models that create a test and verification environment. These models create complex stimuli and receive complex responses from the model tested. These components can be transactors (XACTORS)—models generally having a program interface (API) that allows control by tests outside the model, these tests generally being written in high level language (HLL).

The verification environment can also contain components called Monitoring Blocks (MONITOR) and components called Verification Blocks (VERIFIER). These components are not directly involved in the exchange of signals between the other components of the global simulation model, but are used to observe and interpret them. The Monitoring Blocks (MONITOR) serve as analysis aids for the tests; they have program interfaces (APIs) for signaling events observed in the global model signals. The Verification Blocks (VERIFIER) are components that have a reference specification for the operation of the model being tested, and by observing the signals of the global simulation model, are capable of verifying the proper operation of the model.

Figure 1:
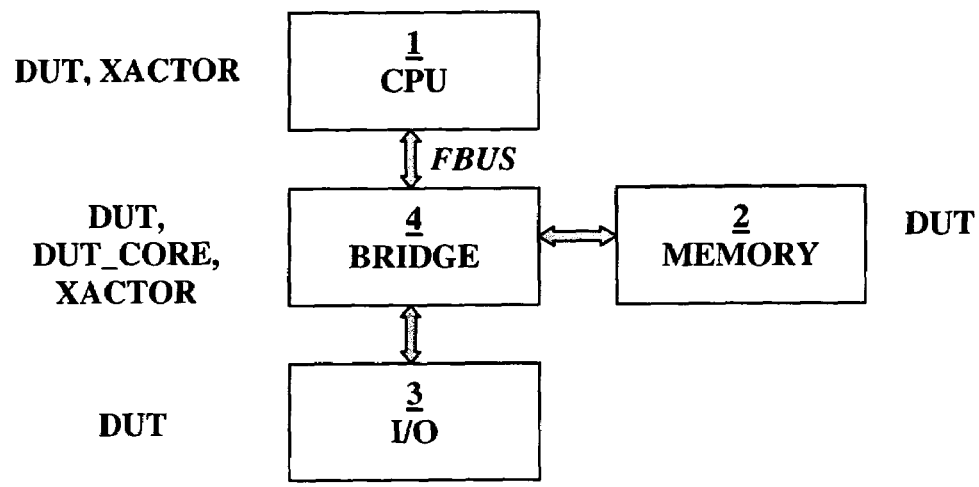
FIG. 1 represents, in a very schematic form, an exemplary global simulation model.
Figure 2:
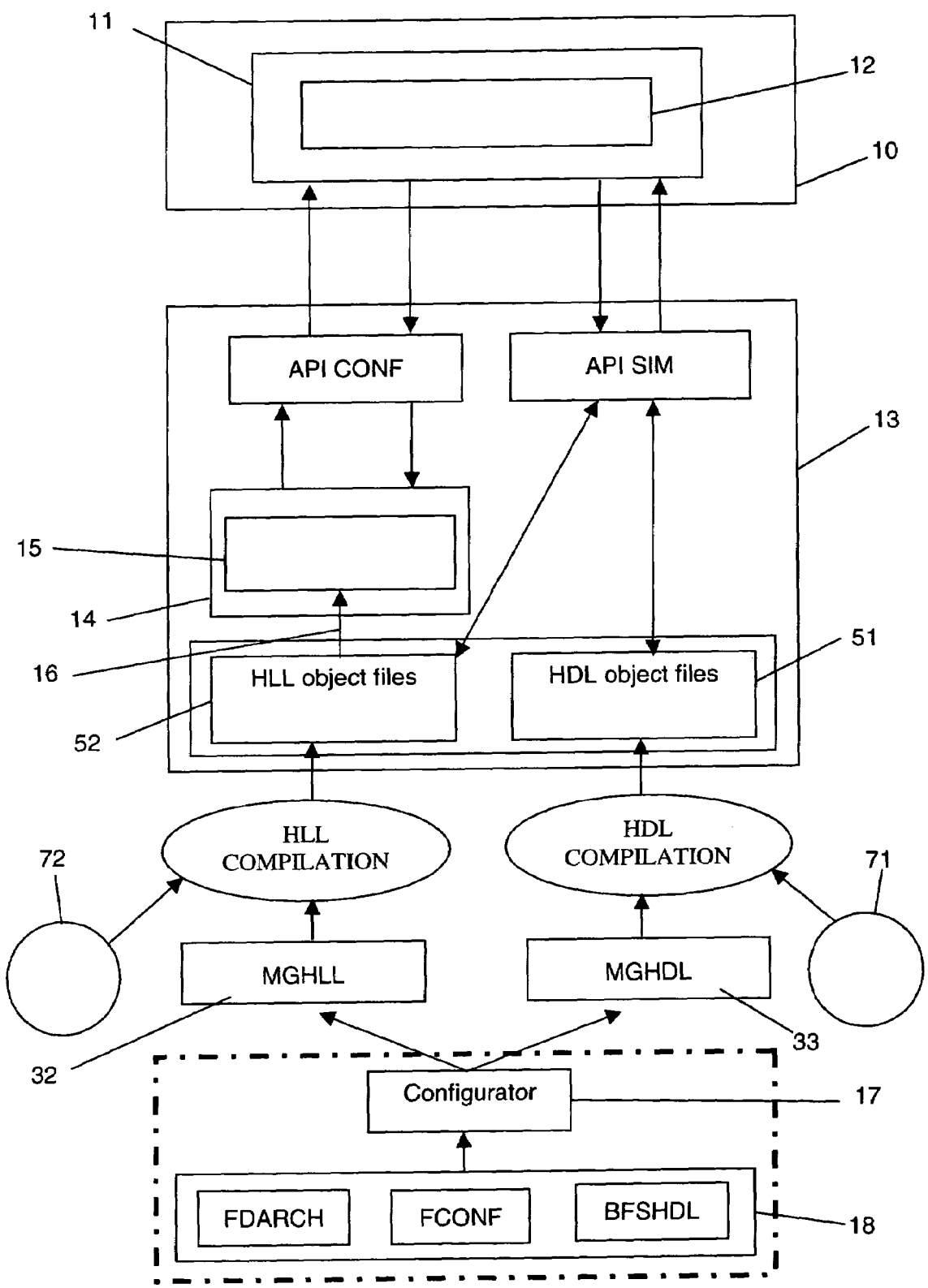
FIG. 2 represents a diagram illustrating the various components of the automatic recognition system and the steps for implementing these components in the method of the invention.
Figure 4A:
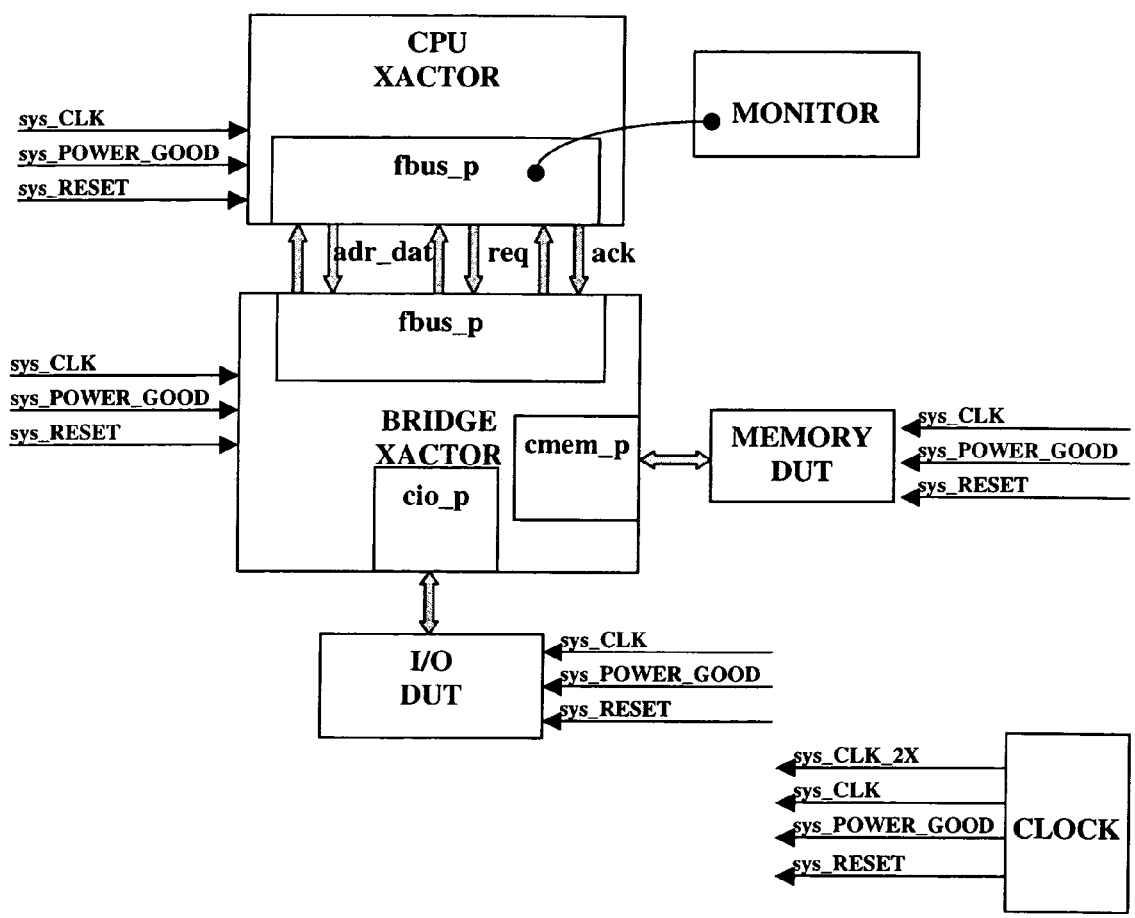
Figure 4B:
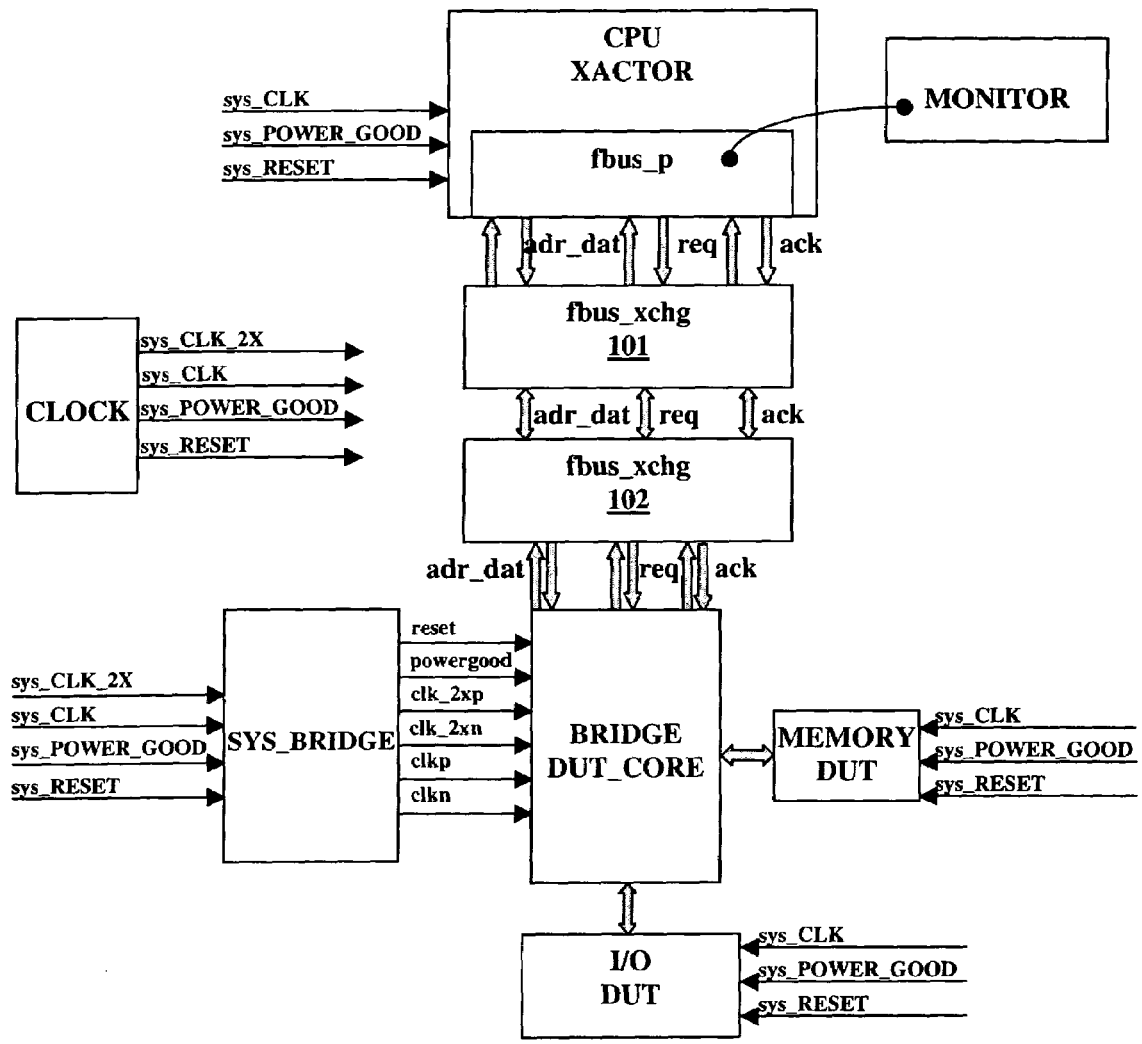
Figure 4C:
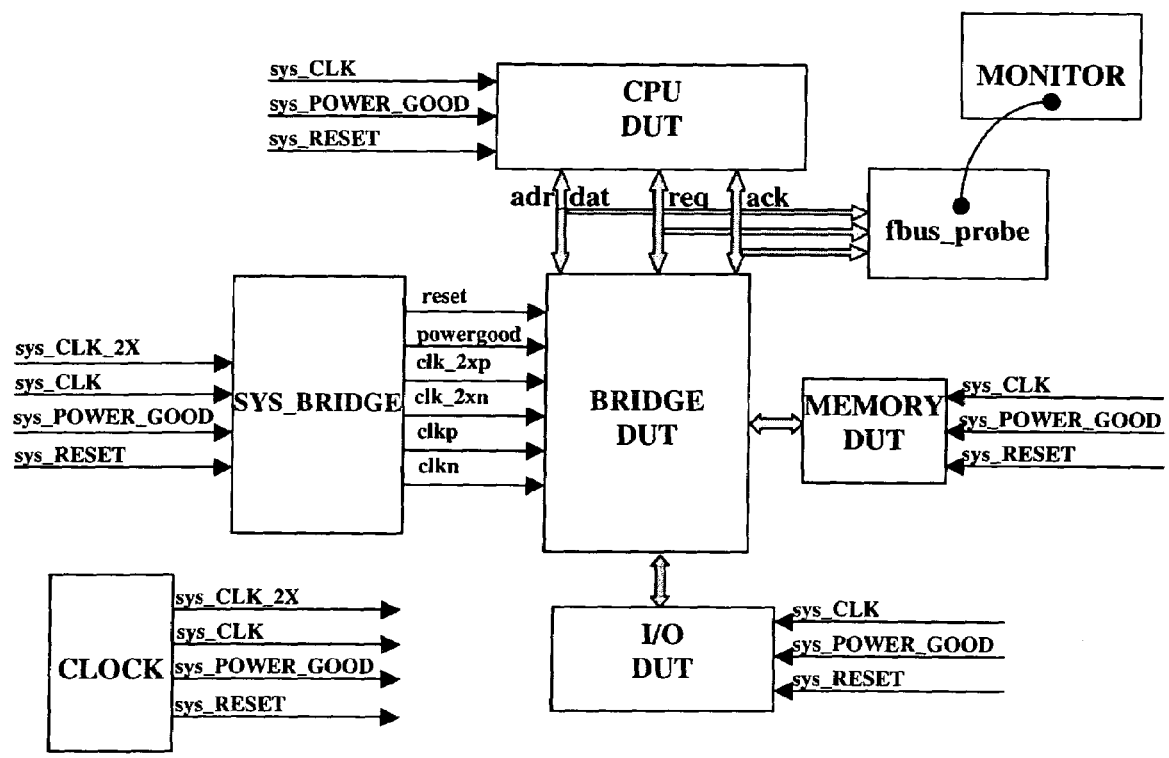

FIG. 1 represents an exemplary architecture of a system comprising an integrated circuit under development, constituted by a processor (1) (CPU) communicating through a bridge (4) (BRIDGE) with a system memory (2) (MEMORY) and input-outputs (3) (I/O). FIGS. 4a, 4b and 4c represent three global simulation models of the architecture of FIG. 1, in successive stages of a project, FIGS. 4a and 4b being examples of intermediate stages of evolution toward the model in FIG. 4c, which can represent a final global model. Each global simulation model is generated by a user of the automatic recognition system, either manually or through an automatic configuration generator, called a configurator (17, FIG. 2), making it possible to generate an arbitrary configuration from at least one file comprising the conditions for generating the configuration (18). The configurator (17) is, for example, the one described in the patent application "SYSTEM AND METHOD FOR AUTOMATICALLY GENERATING A GLOBAL SIMULATION MODEL OF AN ARCHITECTURE" filed by the Applicant on the same day as this one. In the embodiment of FIG. 2, the conditions for generating the configuration (18) are distributed into three files, respectively comprising a description of the architecture of the global simulation model (FDARCH), a synthetic description of the configuration to be generated (FCONF) and a description of the HDL-type interfaces of the components (BFSHDL).

The user of the system according to the invention generates, manually or using the configurator (17), two files MGHDL (33) and MGHLL (32), which will serve as source files for the simulation. The file MGHDL (33) instantiates the HDL parts of the model and describes, in an HDL-type language, the connection of the components to one another, and the file MGHLL (32) contains instances, written in an HLL type language, comprising the characteristics of each component.

The system for the automatic recognition of simulation configurations according to the invention allows the tests to verify their suitability for the configuration during the simulation, and to adapt themselves to the simulation, in order not to have to write a test for every configuration variant.

The global model represented in FIG. 4b, which for example can be produced by the configurator, is constituted by a processor component CPU of the XACTOR type, connected by an interface of the "fbus_p" type to an intermediate block (fbus_xchg) (101) having an interface of a different type. Another intermediate block (fbus_xchg) (102) connects the first intermediate block (101) to a bridge-type component (BRIDGE) of the DUT_CORE type that communicates with a model, written mostly in an HDL-type language, of a memory (MEMORY) of the DUT type, with a model written mostly in an HDL-type language of an input/output (I/O) of the DUT type, and with a system block (SYS_BRIDGE) of the DUT type.

Each type of Component can be described in several levels of detail (functional, behavioral, gates, etc.) in an HDL-type language like VERILOG or VHDL, or in a high level language (HLL) like C or C++, completed by an HDL-type interface. Several description levels for describing similar functionalities can coexist and can have HDL-type interfaces that are similar but not necessarily identical. Certain descriptions can have more functionalities, and the HDL-type interfaces can contain completely different signal sets.

Each instance of a component in this schema obtains identification parameters of the component, i.e., at least one name or label that identifies the position of the component (for example, CPU_0, BRIDGE_0, CMEM_0), a type (for example DUT, VERIFIER, XACTOR, MONITOR), and an HDL path corresponding to the hierarchical name of the component in the global simulation model. An exemplary definition of the identification parameters of a component is given in Appendix 1.

Figure 3A:
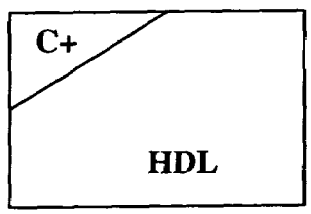
FIGS. 3a through 3c represent various stages in the modeling of a circuit using a mixed model of the HDL (VERILOG or VDHL) type and the HLL (C++) type and FIGS. 4a through 4c represent various configurations of the global simulation model corresponding to the architecture represented in FIG. 1.
Figure 3B:
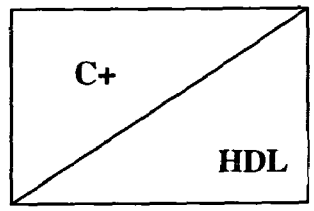
Figure 3C:
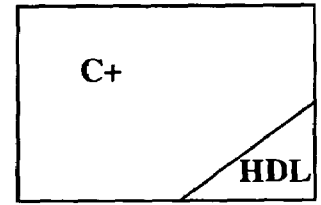

The components are described, as represented in FIGS. 3a through 3c, in both an HDL-type language and an HLL-type language.

In the case of a component described entirely in an HDL-type language (FIG. 3a), the HLL-type part is reduced to one instance, which makes it possible to signal its presence in the configuration during the simulation and supplies the paths for access to the HDL-type resources of the component. In the case where an HDL-type component does not need to be identified by the test, the presence of the HLL part is optional, making it possible to simplify the global simulation model.

For the components described in an HLL-type language (FIG. 3c), it is the HDL-type part that is reduced to a strict minimum and is limited to the description of the interface registers and signals.

All of the intermediate levels between these two extremes are possible, and are naturally used in the context of processes for developing ASIC circuits.

The HLL-type part of the components is constructed by an instance constructor. It is this part that includes the identification parameters of the component (name, type, HDL path, etc.).

An exemplary instance identifying a component, written in C++, is given in Appendix 4.

FIG. 2 illustrates the principle of the method for the automatic recognition of simulation configurations according to the invention. The operation of the method for automatic configuration recognition will be described, in a nonlimiting way, in a client-server architecture, as represented in FIG. 2. The method for automatic configuration recognition also works in a single machine or in a multiclient-multiserver architecture distributed over several machines, each machine comprising at least one server or client of the architecture. The utilization of a client-server architecture is particularly useful in the case where there is not enough memory in the machine constituting the server to implement the method.

The global simulation model is constituted by HDL and HLL source files (respectively marked MGHDL and MGHLL) and all of the HDL component libraries (71) and HLL library modules (72) to which they respectively refer. The two parts of the global module are then compiled to produce the HDL object files (51) and HLL object files (52) used by the simulator. The HLL object files are integrated into the linking simulator using a standardized API (for example PLI for VERILOG), and the HDL object files will be used directly by the simulator to create the models of the components. The server (13) comprises a manager called ServerRegistry (14), which comprises at least one table m_pInstanceMap (15) that stores information on the instance. The client (10) also comprises a manager called ClientRegistry (11) comprising at least one table m_serverConfigMap (12), in which is stored, at the start of the configuration recognition method, the information on the instances of the components present in the simulated model.

At the start of each simulation, the constructors of the object instances are called. Each constructor calls a special procedure called Register of the class ServerRegistry (Appendix 3), transmitting to it the information on the instance; this information is stored (16) in the table m_pInstanceMap (15).

The method according to the invention allows the client to verify the suitability of each simulation test provided by the client to the configuration with which the test is associated.

To do this, the client (10) sends a request that is part of the class QueryReq, via the manager of the client ClientRegistry (11), to the manager of the server ServerRegistry (14). A program interface API CONF, present in the server (13), makes it possible to translate the request into a language understandable by the manager of the server ServerRegistry (14). The request QueryReq allows the client (10) to be informed of the presence of a component in the configuration and its type. The client (10) asks, for example, if this type of component is present in a given configuration, and if so, where it is. The client (10) can also launch a request in order to inform itself of the presence and the type of all of the elements included in one or more configurations, in one or more servers, by specifying as parameters (Appendix 1, class QueryReq) INSTANCE_ANY, TYPE_ANY and SERVER_ANY, respectively. The manager of the server ServerRegistry (14) searches in the table m_pInstance Map (15) and sends a response to the manager of the client ClientRegistry (11) via the API CONF, formulated by the class QueryRsp. An exemplary class ServerRegisty of the manager of the server is given in Appendix 3. If the manager of the server ServerRegistry (14) finds the type of component sought, it indicates this in the response by specifying, based on what it was asked for in the request, the information included in the request associated with each component. The response contains, for example, the name (label), the type of the component, its HDL path, the name of the configuration, and the name of the server in which it is simulated. In the case where the component sought is not present in the configuration, the response contains an error notification (INSTANCE_NONE, TYPE_NONE). The manager of the client ClientRegistry (11) then stores the response in the table m_serverConfigMap (12), forming a cache of the table of the server manager. An example of this procedure is given in Appendix 2. In the case of a multi-server simulation, the table of the client manager contains the sum of the contents of the tables of all the servers used. In this case, the test uses the name of the server associated with each component to address the stimuli to the appropriate server. If the components and their type correspond to the requirements of the test, the test adapts itself to the configuration by disabling, activating and/or modifying certain parts of the test based on whether or not the components and their particular type are present. This makes it possible to use the same test for different configurations.

The client (10) can then execute the simulation test in the server (13) via a program interface API SIM, which translates the test into stimuli. Appendix 5 illustrates the definition of the client classes that allow access to the API SIM corresponding to the architecture represented in FIG. 1. If the configuration does not correspond to the needs of the test, an error is signaled. An exemplary test corresponding to the architecture represented in FIG. 1 is given in Appendix 6. This test can only be executed correctly if the following components are present: CPU_0 of an arbitrary type, CMEM_0 and/or CIO-0 of an arbitrary type and BRIDGE_0 of type DUT_CORE. For CPU_0 of type DUT, a specific operation is applied—a procedure call self_test( ) and reset( ). In the main loop of the test, the memory and input/output accesses are executed conditionally based on the presence of the components CMEM_0 and CIO_0. The test in Appendix 6 corresponds to the configuration of FIG. 4b or its variants. The corresponding files MGHLL and MGHDL, generated by the automatic configurator system (17) are given in Appendices 7 and 8, respectively.

It is understood that the present invention can be implemented in other specific forms, without going beyond its scope of application as claimed. Consequently, the present detailed description should be considered to be a simple illustration of a particular case within the context of the invention, and can therefore be modified without going beyond the scope defined by the attached claims.

APPENDIX 1

```
/*++**************************************************
*
* Copyright (c) 2000 BULL - Worldwide Information Systems
*                    All rights reserved
*
```

APPENDIX 1-continued

```
* Module name : registry.hpp
* Author       : Andrzej Wozniak
*
*__***************************************************/
#ifndef HPP_REGISTRY_HPP
#define HPP_REGISTRY_HPP
///////////////////////
#include <map.h>
#include <strstream>
#include <string>
///////////////////////
class LabelClass {
public:
    enum InstLabel {
        //
        CPU_0 = 0x0010,
        CPU_1 = 0x0011,
        //
        BRIDGE_0 = 0x0020,
        BRIDGE_1 = 0x0021,
        //
        CMEM_0   = 0x0030,
        CMEM_1   = 0x0031,
        //
        CIO_0    = 0x0040,
        CIO_1    = 0x0041,
        //
        CPU_0_BRIDGE_0 = 0x2010,
        BRIDGE_0_CPU_0 = 0x1020,
        CPU_1_BRIDGE_1 = 0x2111,
        BRIDGE_1_CPU_1 = 0x1121,
        //
        INSTANCE_ANY = 0xffff,
        INSTANCE_NONE = 0x0000
    };
};
//////
class TypeClass {
public:
    enum InstType {
        DUT        = 0x0001,
        DUT_CORE   = 0x0002,
        XACTOR     = 0x0004,
        MONITOR    = 0x0008,
        VERIFIER   = 0x0010,
        FBUS_XCHG  = 0x0020,
        //
        TYPE_ANY   = 0xffff,
        TYPE_NONE  = 0x0000
    };
};
//////
class Registry : public LabelClass, public TypeClass {
public:
    typedef long unsigned int Handle_t;
public:
    static const string SERVER_ANY;
    static const int MAX_CLIENT_NB = 16;
    static const int MAX_SERVER_NB = 8;
public:
////
    typedef long long unsigned int CombinedID_t;
};
    ////
class QueryReq : public Registry {
 public:
    QueryReq(const string& serverName = SERVER_ANY,
             int clientNum = 0,
             InstLabel instanceLabel = INSTANCE_ANY,
             InstType instanceType   = TYPE_ANY);
    public:
        string m_serverName;
        int m_clientNum;
        InstLabel m_instanceLabel;
        InstType m_instanceType;
    };
class QueryRsp : public Registry {
public:
    QueryRsp(long unsigned int iihandle = 0,
             const string& serverName = SERVER_ANY,
             InstLabel instanceLabel = INSTANCE_ANY,
             InstType instanceType = TYPE_ANY,
             const string& instanceName = string(" "),
             const string& instanceVerilogPath = string(" "));
public:
    long unsigned int m_handle;
    string m_serverName;
    InstLabel m_instanceLabel;
    InstType m_instanceType;
    string m_instanceName;
    string m_instanceVerilogPath;
    string m_fullInstanceName;
};
class QueryError{
public:
    const string m_err;
    QueryRsp m_qrsp;
    QueryError(const string& err, const QueryRsp& qrsp):
        m_err(err),
        m_qrsp(qrsp){ }
};
////
ostream& operator<< (ostream& str, const QueryReq& qrq);
istream& operator>> (istream& str, QueryReq& qrq);
ostream& operator<< (ostream& str, const QueryRsp& qrsp);
istream& operator>> (istream& str, QueryRsp& qrsp);
typedef int Status;
#endif /* HPP_REGISTRY_HPP */
```

APPENDIX 2

```
/*++****************************************************
*
*    Copyright (c) 2000 BULL - Worldwide Information Systems
*                         All rights reserved
*
* Module name : client_registry.hpp
* Author       : Andrzej Wozniak
*
*__***************************************************/
#ifndef HPP_CLIENT_REGISTRY_HPP
#define HPP_CLIENT_REGISTRY_HPP
#include <map>
#include "registry.hpp"
#include "client_component.hpp"
class ClientRegistry : public Registry {
public:
    typedef map<int, QueryRsp*> QueryMap_Type;
public:
    static Status QueryServerConfig( );
    static const QueryRsp& QueryServer(InstLabel iid, InstType ict);
    static const QueryMap_Type& getQueryMap( );
    static QueryRsp& QueryComponent(InstLabel iid, InstType ict);
private:
    static QueryMap_Type m_serverConfigMap;
    static QueryMap_Type::iterator m_it;
public:
    static int getServerNumber( );
    static int getClientOwnNum( );
    static string& getConfigName( );
};
#endif /* HPP_CLIENT_REGISTRY_HPP */
```

APPENDIX 4

```
/*++****************************************************
*
* Copyright (c) 2000 BULL - Worldwide Information Systems
*                         All rights reserved
*
* Module name : server_registry.hpp
```

APPENDIX 4-continued

```
 * Author      : Andrzej Wozniak
 *
 *__***************************************************/
#ifndef HPP_SERVER_REGISTRY_HPP
#define HPP_SERVER_REGISTRY_HPP
#include "registry.hpp"
#include "component.hpp"
#include <map>
class ServerRegistry : public Registry {
public:
    static Status Register(ComponentIdent* p_comp);
    static ComponentIdent* getInstance(InstLabel ilabel,
InstType itype);
    static const ComponentIdent* c_getInstance(InstLabel ilabel,
InstType itype);
public:
    static Status QueryServer( );
private:
    typedef map<CombinedID_t, ComponentIdent*> Map_t;
    static Map_t* m_pInstanceMap;
    static int m_clientNumber;
    static const string m_serverName;
    static const string m_configName;
public:
    static const string& getServerName( );
    static const string& getConfigName( );
    static int getServerNumber( );
    static int getClientNumber( );
public:
    //
} ; // ServerRegistry class
#endif /* HPP_SERVER_REGISTRY_HPP */
/*++***************************************************
 *
 * Copyright (c) 2000 BULL - Worldwide Information Systems
 *                  All rights reserved
 *
 * Module name : Component.hpp
 * Author      : Andrzej Wozniak
 *
 *__***************************************************/
#ifndef HPP_COMPONENT_HPP
#define HPP_COMPONENT_HPP
///////////////////////
#include <string>
#include "registry.hpp"
///////////////////////
class ComponentIdent : public Registry {
public:
    ComponentIdent(InstLabel ilabel,    InstType itype,
                   const string iname, const string hdlpath);
    virtual ~ComponentIdent( );
public:
    InstLabel m_ilabel;
    InstType m_itype;
    string m_iname;
    string m_hdlpath;
};
#endif /* HPP_COMPONENT_HPP */
```

APPENDIX 5

```
/*++***************************************************
 *
 * Copyright (c) 2000 BULL - Worldwide Information Systems
 *                  All rights reserved
 *
 * Module name : client_component.hpp
 * Author      : Andrzej Wozniak
 *
 *__***************************************************/
#ifndef HPP_CLIENT_COMPONENT_HPP
#define HPP_CLIENT_COMPONENT_HPP
class ClientComponent {
protected:
    ClientComponent( );
public:
    static ClientComponent* create (QueryRsp qrsp);
public:
    virtual int mem_write (unsigned long long addr, unsigned long
long data);
    virtual int mem_read_compare (unsigned long long addr,
unsigned long long data);
    virtual int io_write (unsigned long long addr, unsigned long
long data);
    virtual int io_read_compare(unsigned long long addr,
unsigned long long data);
    virtual int self_test( );
    virtual int reset( );
    virtual int cache_clear( );
    virtual int cache_flush( );
    virtual int get_err_nbr( );
};
int PrintError(const string msg);
#endif /* HPP_CLIENT_COMPONENT_HPP */
```

APPENDIX 6

```
/*++***************************************************
 *
 * Copyright (c) 2000 BULL - Worldwide Information Systems
 *                  All rights reserved
 *
 * Module name : example_test.cpp
 * Author      : Andrzej Wozniak
 *
 *__***************************************************/
#include "client_registry.hpp"
int Test (int argc, char* argv[ ]){
    /////////// CONFIGURE SECTION ///////////
    ClientRegistry::QueryServerConfig( );
    QueryRsp &qrs_cpu_0    =
ClientRegistry::QueryComponent(LabelClass::CPU_0,TypeClass::TYPE_ANY);
    QueryRsp &qrs_mem_0    =
ClientRegistry::QueryComponent(LabelClass::CMEM_0,TypeClass::TYPE_ANY);
```

APPENDIX 6-continued

```
    QueryRsp &qrs_cio_0 =
ClientRegistry::QueryComponent(LabelClass::CIO_0,TypeClass::TYPE_ANY);
    QueryRsp &qrs_bridge_0 =
ClientRegistry::QueryComponent(LabelClass::BRIDGE_0,
TypeClass::DUT_CORE);
    int err_status = 0;
    if (qrs_cpu_0.m_instanceLabel == LabelClass::INSTANCE_NONE) {
        PrintError("Component CPU_0 is missing\n");
        ++err_status;
    }
    if(qrs_mem_0.m_instanceLabel == LabelClass::INSTANCE_ANY
         &&   qrs_cio_0.m_instanceLabel ==
LabelClass::INSTANCE_ANY) {
        PrintError("Components MEM_0 and CIO_0 are both
missing\n")
        ++err_status;
    }
    if(qrs_bridge_0.m_instanceType != TypeClass::DUT_CORE) {
        PrintError("Component BRIDGE_0 of type DUT_CORE is
missing\n")
        ++err_status;
    }
    if(err_status) {
        PrintError("aborting test\n");
        return -1;
    }
    //////// constructing client components
    ClientComponent* cpu_0 = ClientComponent::create(qrs_cpu_0);
    ClientComponent* mem_0 = ClientComponent::create(qrs_mem_0);
    ClientComponent* cio_0 = ClientComponent::create(qrs_cio_0);
    ClientComponent* bridge_0 =
ClientComponent::create(qrs_bridge_0);
    //////
    const int MAX_CYCLES = 4096;
    const unsigned long long mem_base = 0x8123456787665500ULL;
    const unsigned long long cio_base = 0xFFFFFFFFFABCD100ULL;
    if(qrs_cpu_0.m_instanceType == TypeClass::DUT) {
        cpu_0->self_test( );
        cpu_0->reset( );
    }
    bridge_0->cache_clear( );
    for(int ii; ii<MAX_CYCLES; ++ii){
        if(qrs_mem_0.m_instanceLabel != LabelClass::INSTANCE_ANY){
            cpu_0->mem_write(mem_base+8*ii,
0xa5a5a5a5a5a50000ULL+ii);
}
        if(qrs_cio_0.m_instanceLabel != LabelClass::INSTANCE_ANY){
            cpu_0->io_write(cio_base+4*ii,
0xc3c3c3c3c3c30000ULL+ii);
        }
    }
    bridge_0->cache_flush( );
    for(int ii; ii<MAX_CYCLES; ++ii){
        if(qrs_mem_0.m_instanceLabel != LabelClass::INSTANCE_ANY){
            cpu_0->mem_read_compare(mem_base+8*ii,
0xa5a5a5a5a5a50000ULL+ii);
        }
        if(qrs_cio_0.m_instanceLabel != LabelClass::INSTANCE_ANY){
            cpu_0->io_read_compare(cio_base+4*ii,
0xc3c3c3c3c3c30000ULL+ii);
        }
    }
    return cpu_0->get_err_nbr( ) + mem_0->get_err_nbr( ) + cio_0-
>get_err_nbr( ) + bridge_0->get_err_nbr( );
}
```

APPENDIX 7

```
////////////////////////////////
// FILE GENERATED by A. W. PERL SCRIPT
// FROM patent/sim/configs/pat03.cfg file
// FOR server
////////////////////////////////
///////////
#include "server_registry.hpp"
```

APPENDIX 7-continued

```
#include "server_components.hpp"
///////////
const string ServerRegistry::m_serverName = "SERVER";
const string ServerRegistry::m_configName = "pat03";
const int ServerRegistry::m_serverNumber = 1;
Status InstantiateConfiguration( ) {
///////////
```

APPENDIX 7-continued

```
static Fbus_hwif CPU_0_XACTOR_FBUS_p (LabelClass::CPU_0,
TypeClass::FBUS_type,
            string("top.CPU_0_XACTOR_FBUS_p"));
static Cio_Dut CIO_0 (LabelClass::CIO_0, TypeClass::DUT,
            string("top.CIO_0"));
static Cmem_Dut CMEM_0 (LabelClass::CMEM_0, TypeClass::DUT,
            string("top.CMEM_0"));
static Bridge_Dut BRIDGE_0 (LabelClass::BRIDGE_0,
TypeClass::DUT_CORE,
            string("top.BRIDGE_0"));
static CPU_Xactor CPU_0_XACTOR (LabelClass::CPU_0,
TypeClass::XACTOR,
            &CPU_0_XACTOR_FBUS_p);
```

APPENDIX 7-continued

```
static CPU_Monitor CPU_0_MONITOR (LabelClass::CPU_0,
TypeClass::MONITOR,
            &CPU_0_XACTOR_FBUS_p);
static Fbus_Xchg BRIDGE_0_CPU_0_FBUS_XCHG
(LabelClass::BRIDGE_0_CPU_0, TypeClass::FBUS_XCHG,
            string("top.BRIDGE_0_CPU_0_FBUS_XCHG"));
static Fbus_Xchg CPU_0_BRIDGE_0_FBUS_XCHG
(LabelClass::CPU_0_BRIDGE_0, TypeClass::FBUS_XCHG,
            string("top.CPU_0_BRIDGE_0_FBUS_XCHG"));
    return Success;
}
////////////
// END
////////////
```

APPENDIX 8

```
////////////////////////////////////////////////////////
FILE "config_server_pat03_top.v" GENERATED by A. W. PERL SCRIPT
//    FROM "patent/sim/configs/pat03.cfg"   file
////////////////////////////////////////////////////////
//////
`timescale 100ps
//////
module top ( );
wire        POWER_GOOD;
wire        RESET;
wire        CLK_33MHz;
wire        CLK_66MHz;
Clock SysClock(
        .sys_POWER_GOOD    (POWER_GOOD)
        .sys_RESET         (RESET),
        .sys_CLK           (CLK_33MHz),
        .sys_CLK_2X        (CLK_66MHz)
                    );
////////////////////////////////
///// Wire Declaration Section
////////////////////////////////
// wire        CLK_33MHz;              // output(1)
// wire        CLK_66MHz;              // input(3) output(1)
// wire        POWER_GOOD;             // input(3) output(1)
// wire        RESET;         // input(3) output(1)
wire [3:0] W1_00_inXXack;              // input(1) output(1)
wire [63:0]    W1_00_inXXadr_dat;              // input(1)
output (1)
wire [3:0] W1_00_inXXreq;              // input(1) output(1)
wire [3:0] W1_00_outXXack;             // input(1) output(1)
wire [63:0]    W1_00_outXXadr_dat;             // input(1)
output (1)
wire [3:0] W1_00_outXXreq;             // input(1) output(1)
wire [3:0] W_00_XXack;                 // inout(2)
wire [63:0]    W_00_XXadr_dat;                 // inout(2)
wire [3:0] W_00_XXreq;                 // inout(2)
wire [31:0]    W_00_YYadr;                     // input(1) output(1)
wire [2:0] W_00_YYctrl;                // input(1) output(1)
wire [63:0]    W_00_YYdata;                    // inout(2)
wire [1:0] W_00_ZZack;                 // input(1) output(1)
wire [15:0]    W_00_ZZdata;                    // inout(2)
wire [1:0] W_00_ZZreq;                 // input(1) output(1)
////////////////////////////////
wire        W_00_clk_2xn;              // input(1) output(1)
wire        W_00_clk_2xp;              // input(1) output(1)
wire        W_00_clkn;                 // input(1) output(1)
wire        W_00_clkp;                 // input(1) output(1)
wire [3:0] W_00_inXXack;               // input(1) output(1)
wire [63:0]    W_00_inXXadr_dat;               // input(1)
output (1)
wire [3:0] W_00_inXXreq;               // input(1) output(1)
wire [3:0] W_00_outXXack;              // input(1) output(1)
```

APPENDIX 8-continued

```
    wire [63:0]    W_00_outXXadr_dat;        // input(1) output (1)
    wire [3:0] W_00_outXXreq;                // input(1) output(1)
    wire       W_00_powergood;               // input(1) output(1)
    wire       W_00_reset;                   // input(1) output(1)
         //////////////////////////////
         ///// Module Instancies Section
         //////////////////////////////
//// BRIDGE_0_CPU_0_FBUS_XCHG -> IND_CON -> FBUS_xchg
//////////
fbus_xchg      BRIDGE_0_CPU_0_FBUS_XCHG (
         .XXadr_dat            (W_00_XXadr_dat),
         .XXreq                (W_00_XXreq),
         .XXack                (W_00_XXack),
         .inXXadr_dat          (W1_00_outXXadr_dat),
         .outXXadr_dat         (W1_00_inXXadr_dat),
         .inXXreq              (W1_00_outXXreq),
         .outXXreq             (W1_00_inXXreq),
         .inXXack              (W1_00_outXXack),
         .outXXack             (W1_00_inXXack));
//// CMEM_0 -> DUT -> CMEMD //////////
cmem    CMEM_0 (
         .YYadr                (W_00_YYadr),
         .YYdata               (W_00_YYdata),
         .YYctrl               (W_00_YYctrl),
         .clk        (CLK_66MHz),
         .reset                (RESET),
         .powergood                  (POWER_GOOD));
//// CIO_0 -> DUT -> CIOD //////////
cio     CIO_0 (
         .ZZdata               (W_00_ZZdata),
         .ZZreq                (W_00_ZZreq),
         .ZZack                (W_00_ZZack),
         .clk        (CLK_66MHz),
         .reset                (RESET),
         .powergood                  (POWER_GOOD));
//// BRIDGE_0 -> DUT_CORE -> BRD //////////
bridge_core            BRIDGE_0 (
         .inXXadr_dat          (W1_00_inXXadr_dat),
         .outXXadr_dat         (W1_00_outXXadr_dat),
         .inXXreq              (W1_00_inXXreq),
         .outXXreq             (W1_00_outXXreq),
         .inXXack              (W1_00_inXXack),
         .outXXack             (W1_00_outXXack),
         .YYadr                (W_00_YYadr),
         .YYdata               (W_00_YYdata),
         .YYctrl               (W_00_YYctrl),
         ZZdata                (W_00_ZZdata),
         .ZZreq                (W_00_ZZreq),
         .ZZack                (W_00_ZZack),
         .clk_2xp              (W_00_clk_2xp),
         .clk_2xn              (W_00_clk_2xn),
         .clkp                 (W_00_clkp),
         .clkn                 (W_00_clkn),
         .reset                (W_00_reset),
         .powergood                  (W_00_powergood));
//// CPU_0_BRIDGE_0_FBUS_XCHG -> IND_CON -> FBUS_xchg
//////////
fbus_xchg      CPU_0_BRIDGE_0_FBUS_XCHG (
         .XXadr_dat            (W_00_XXadr_dat),
         .XXreq                (W_00_XXreq),
         .XXack                (W_00_XXack),
         .inXXadr_dat          (W_00_outXXadr_dat),
         .outXXadr_dat         (W_00_inXXadr_dat),
         .inXXreq              (W_00_outXXreq),
         .outXXreq             (W_00_inXXreq),
         .inXXack              (W_00_outXXack),
         .outXXack             (W_00_inXXack));
//// CPU_0 -> XACTOR -> FBUS_p //////////
fbus_p         CPU_0_XACTOR_FBUS_p (
         .inXXadr_dat          (W_00_inXXadr_dat),
         .outXXadr_dat         (W_00_outXXadr_dat),
         .inXXreq              (W_00_inXXreq),
         .outXXreq             (W_00_outXXreq),
         .inXXack              (W_00_inXXack),
         .outXXack             (W_00_outXXack),
         .clk        (CLK_66MHz),
         .reset                (RESET),
         .powergood                  (POWER_GOOD));
```

APPENDIX 8-continued

```
//// BRIDGE_0_sys -> SYS_CON -> BRIDGE_sys ////////////
sys_bridge #(0, 32'h00000007)   BRIDGE_0_sys (
            .clk_2xp            (W_00_clk_2xp),
            .clk_2xn            (W_00_clk_2xn),
            .clkp               (W_00_clkp),
            .clkn               (W_00_clkn),
            .reset              (W_00_reset),
            .powergood                      (W_00_powergood),
            .sys_CLK_2X                     (CLK_66MHz),
            .sys_CLK            (CLK_33MHz),
            .sys_RESET                      (RESET),
            .sys_POWER_GOOD                 (POWER_GOOD));
endmodule
////////////
// END
////////////
```

The invention claimed is:

1. A method for automatic recognition of available simulation configurations of integrated circuits under design comprising at least two components connected to one another, directly or indirectly, and for functional verification of said integrated circuits through a simulation test comprising:

acquiring a simulation configuration by a server manager, associated with a simulator, during initialization of a simulator program, in which all constructors of HLL (C++) instances of components present in a current global simulation model are called, registering the presence of each of said constructors by transmitting parameters of each of said constructors to the server manager, constructing an instance table of the components by said server manager, sending a request by a client manager, to the server manager to determine whether the components expected in a configuration by the client manager are present and determining their positions and their types, sending a response by the server manager to the client manager, after a consultation of the instance table of the components, said response containing the instances of the components present and/or an error notification in case of the absence of one or more expected components, storing the response in at least one configuration model storage table by the client manager, comparing the response by the client manager with the requirements of the simulation test, and disabling, activating and/or modifying certain parts of the simulation test by the client manager in order to adapt the simulation test to the configuration, or signaling of an error if the simulation test cannot be adapted to the configuration.

2. The method for the automatic recognition of available simulation configurations according to claim 1, comprising generating the available simulation configurations from configuration generation data prior to the utilization of the method.

3. The method for the automatic recognition of available simulation configurations according to claim 2, wherein the generation of the available simulation configurations is controlled by an operator.

4. The method for the automatic recognition of available simulation configurations according to claim 3, wherein the step for sending a request is followed by a step for translation of said request, by a program interface, into a language understandable by the first server manager, and in that the step for sending a response is followed by a step for translation of said response, by the program interface, into a language understandable by the client manager.

5. The method for the automatic recognition of available simulation configurations according to claim 4, wherein the method operates in a client-server architecture, the server manager being located in the server of the client-server architecture and the client manager is located in the client of the client-server architecture.

6. The method for the automatic recognition of available simulation configurations according to claim 3, wherein the method operates in a client-server architecture, the server manager being located in the server of the client-server architecture and the client manager is located in the client of the client-server architecture.

7. The method for the automatic recognition of available simulation configurations according to claim 2, wherein the generation of the available simulation configurations is controlled by an automatic configuration generator.

8. The method for the automatic recognition of available simulation configurations according to claim 7, wherein the step for sending a request is followed by a step for translation of said request, by a program interface, into a language understandable by the server manager, and in that the step for sending a response is followed by a step for translation of said response, by the program interface, into a language understandable by the client manager.

9. The method for the automatic recognition of available simulation configurations according to claim 8, wherein the method operates in a client-server architecture, the server manager being located in the server of the client-server architecture and the client manager is located in the client of the client-server architecture.

10. The method for the automatic recognition of available simulation configurations according to claim 7, wherein the method operates in a client-server architecture, the server manager being located in the server of the client-server architecture and the client manager is located in the client of the client-server architecture.

11. The method for the automatic recognition of available simulation configurations according to claim 2, wherein the step for sending a request is followed by a step for translation of said request, by a program interface, into a language understandable by the server manager, and in that the step for sending a response is followed by a step for translation of said response, by the program interface, into a language understandable by the client manager.

12. The method for the automatic recognition of available simulation configurations according to claim 11, wherein the method operates in a client-server architecture, the server manager being located in the server of the client-server architecture and the client manager is located in the client of the client-server architecture.

13. The method for the automatic recognition of available simulation configurations according to claim 2, wherein the method operates in a client-server architecture, the server manager being located in the server of the client-server architecture and the client manager is located in the client of the client-server architecture.

14. The method for the automatic recognition of available simulation configurations according to claim 1, wherein the step for sending a request is followed by a step for translation of said request, by a program interface, into a language understandable by the server manager, and in that the step for sending a response is followed by a step for translation of said response, by the program interface, into a language understandable by the client manager.

15. The method for the automatic recognition of available simulation configurations according to claim 14, wherein the method operates in a client-server architecture, the server manager being located in the server of the client-server architecture and the client manager is located in the client of the client-server architecture.

16. The method for the automatic recognition of available simulation configurations according to claim 1, wherein the method operates in a client-server architecture, the server manager being located in the server of the client-server architecture and the client manager is located in the client of the client-server architecture.

17. A system for automatic recognition of available simulation configurations of integrated circuits under design comprising a client manager and server manager associated with a simulator, said simulator comprising constructors of instances of components present in a current global simulation configuration model and means for registering the presence of each of said constructors by transmitting parameters of each of said constructors to said server manager, said server manager having storage means for storing at least one instance table of components present in each configuration, means for filling said instance table with the parameters received from each of said constructors, means for analyzing a message or a request, means for consulting said instance table in response to said message or request and/or means for formulating a message or a response, said response containing the instances of the components present and/or an error notification in case of the absence of one or more expected components and, said client manager having storage means comprising at least one storage table for storing the simulation configuration model, means for consulting said at least one storage table, means for formulating a message and/or a request, means for analyzing the message or a response received from said server manager, and means for filling said storage table with said response.

18. The system to automatically test recognition of configurations according to claim 17, wherein the client manager includes means for disabling, activating and/or modifying certain parts of a test in order to adapt the test based on a response.

* * * * *